United States Patent [19]

Ouvrard et al.

[11] Patent Number: 4,885,562
[45] Date of Patent: Dec. 5, 1989

[54] MICROWAVE DELAY CIRCUIT HAVING A BRIDGE-T CIRCUIT

[75] Inventors: Pierre-Louis Ouvrard, Sevres; Philippe Dueme, Palaiseau, both of France

[73] Assignee: Electronique Serge Dassault, Saint Cloud, France

[21] Appl. No.: 130,852

[22] Filed: Dec. 9, 1987

[30] Foreign Application Priority Data

Jul. 20, 1987 [FR] France ................ 87 10240

[51] Int. Cl.$^4$ ............... H03H 7/07; H03H 7/19; H03H 7/30
[52] U.S. Cl. ..................... 333/139; 333/140; 333/161; 333/170; 333/185
[58] Field of Search ................ 333/138–140, 333/156, 161, 164, 168, 170, 185

[56] References Cited

U.S. PATENT DOCUMENTS

| | | | |
|---|---|---|---|
| 1,977,751 | 10/1934 | Zobel | 333/170 |
| 2,054,794 | 9/1936 | Dietzold | 333/138 |
| 2,177,761 | 10/1939 | Wheeler | 333/170 |
| 2,342,638 | 2/1944 | Bode | 333/138 X |
| 2,392,476 | 1/1946 | Hodgson | 333/138 |
| 3,105,209 | 9/1963 | Budny | 333/170 X |
| 3,116,373 | 12/1963 | Dome | 333/138 X |
| 3,474,181 | 10/1969 | Ayres | 333/138 X |
| 3,568,097 | 3/1971 | Hyltin | 333/161 |
| 3,781,722 | 12/1973 | Pierson | 333/156 |
| 4,063,201 | 12/1977 | Komatsubara et al. | 333/168 |
| 4,203,081 | 5/1980 | Braeckelmann | 333/140 X |
| 4,443,772 | 4/1984 | Schwarzmann | 333/170 X |
| 4,635,005 | 1/1987 | Kaminsky | 333/170 X |
| 4,642,588 | 2/1987 | Kameya | 333/139 |

FOREIGN PATENT DOCUMENTS 28839 3/1977 Japan ................ 333/138

OTHER PUBLICATIONS

Kuh, E. S., "Synthesis of Lumped Parameter Precision Delay Line", IRE Nat'l Convention Record Part 2; 1957; pp. 160–174.

Primary Examiner—Eugene R. LaRoche
Assistant Examiner—Benny Lee
Attorney, Agent, or Firm—Pollock, Vande Sande & Priddy

[57] ABSTRACT

According to the invention, the circuit comprises at least one two-port network of the "M-derived" section type and connected as an all-pass filter with a phase law which is a linear function of frequency. The two-port network is made in monolithic technology on gallium arsenide and the plane of its structure includes at least one elementary section, which, between an inlet and an outlet which are situated at a distance apart, is constituted by a spiral connected in parallel with a capacitor of metal-insulator-metal structure, with the mid point of the spiral being connected via another capacitor of metal-insulator metal structure to a ground plane. It is applicable to making transmission lines which are programamble in length.

11 Claims, 8 Drawing Sheets

MICROWAVE DELAY CIRCUIT HAVING A BRIDGE-T CIRCUIT

The present relates to making microwave transmission lines. More particularly, it relates to a microwave delay circuit made as an all-pass filter using monolithic technology on gallium arsenide. It is applicable to making transmission lines of programmable length.

BACKGROUND OF THE INVENTION

The person skilled in the art knows the advantages of monolithic technology on gallium arsenide (GaAs) for microwave applications.

However, there is problem with delay lines: in order to obtain the equivalent of a transmission line in air having a length of about 1 centimeter and with an impedance of 50 ohms, the necessary area of GaAs would be about 1 square millimeter.

Such a delay line is not satisfactory since the ratio between the area of GaAs used and the length of the equivalent transmission line in air is very high. This technological problem makes it difficult and expensive to provide such a function on a GaAs substrate.

The aim of the invention is to provide a solution to this problem. To this end, the invention provides a microwave delay circuit designed as an all-pass filter having a phase law which is a linear function of frequency and which is capable, particularly with GaAs technology, of occupying a reduced area by virtue of a special disposition of the essential component parts of the circuit in accordance with the invention.

SUMMARY OF THE INVENTION

The invention provides a microwave delay circuit. According to a general definition of the invention, it comprises at least one two-port network of the "M-derived" section type, connected as an all-pass filter and having a phase law which is a linear function of frequency.

The term "all-pass" is used herein with respect to microwave frequencies to designate a circuit whose passband extends over at least about 10 gigahertz (GHz).

More particularly, the two-port network has the same image impedance at its inlet and at its outlet, and said impedance is substantially equal to 50 ohms.

According to another characteristic of the invention, the two-port network is constituted by a bridged-T section comprising:
  two inductors having the same inductance L connected in series to form the two arms of the T, and having a mutual inductance M;
  a capacitor defining the riser of the T and having a capacitance $C_2$; and
  another capacitor constituting the bridge and having a capacitance $C_1$;
and it satisfies, in substance, the relationship:

$$C_2 \cdot \left( \frac{L - M}{L + M} \right) = 4 \cdot C_1$$

The term "M-derived section" is used herein to designate a bridged-T section as defined above, and any electrical equivalent thereof.

In practice, in order to have a phase law which is linear as a function of frequency, the quotient of the mutual inductance M divided by the sum of the inductance L and the mutual inductance M lies between +0.2 and +0.4, and lies preferably between about +0.27 and +0.34.

Advantageously, said ratio lies between +0.30 and +0.33.

The circuit in accordance with the invention is applicable to making transmission lines which are programmable in length. According to another characteristic of the invention, the two-port network is mounted to be switchable in parallel with a direct path which substantially constitutes a short circuit.

In practice, the circuit in accordance with the invention is made in monolithic technology on gallium arsenide.

In a preferred embodiment of the circuit in accordance with the invention, the plan of the structure comprises at least one elementary section which, between an inlet and an outlet which are situated at a distance apart, is constituted by a spiral connected in parallel with a capacitor of metal-insulator-metal structure, with the mid point of the spiral being connected via another capacitor of metal-insulator-metal structure to a ground plane.

The spiral preferably extends round about one and three fourths turns.

When compared with conventional (50 ohm) transmission lines made on a GaAs substrate, this particular disposition of the essential component parts of a circuit in accordance with the invention has the advantage of reducing by a factor of about ten the ratio between the GaAs area required for making such a transmission line and the length of the equivalent transmission line in air.

According to another characteristic of the circuit in accordance with the invention, it comprises a plurality of sections distributed around a common ground plane and connected in series.

This last characteristic makes it possible to provide transmission lines of greater length.

BRIEF DESCRIPTION OF THE DRAWINGS

Embodiments of the invention are described by way of example with reference to the accompanying drawings, in which.

In numerous respects, the accompanying drawings include items which are definitive in nature. The drawings therefore serve not only to clarify the following description, but also, where appropriate, to contribute to defining the invention.

The following description is given purely by way of non-limiting illustration.

MORE DETAILED DESCRIPTION

Figure 1:
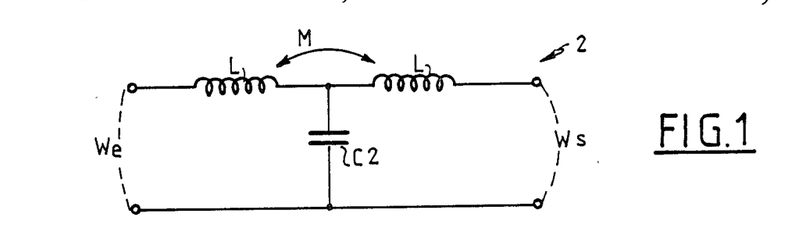
FIG. 1 is a diagram of an elementary M-derived section which is terminated at its inlet and outlet ends on its image impedances and which is useable in accordance with the invention.

In FIG. 1, reference 2 designates a two-port network of the M-derived section type. The section 2 is in the form of a T and comprises a capacitor $C_2$ defining the riser of the T together with two inductors L having the same inductance and connected in series in order to constitute the arms of the T. The two inductors L have a mutual inductance of M.

When a plurality of sections 2 are put into cascade in order to constitute 50 ohm impedance transmission lines, each section 2 is terminated both at its inlet end and at its outlet end by its own image impedances $W_e$ and $W_s$ respectively.

An image impedance is an impedance which is applied as a terminating load, for example at the outlet of a two-port network, in order to obtain the same impedance at the inlet to the network.

Upstream (inlet) and downstream (outlet) terminations on the image impedances of the section 2 thus serve to provide inlet-outlet impedance matching.

Figure 2:
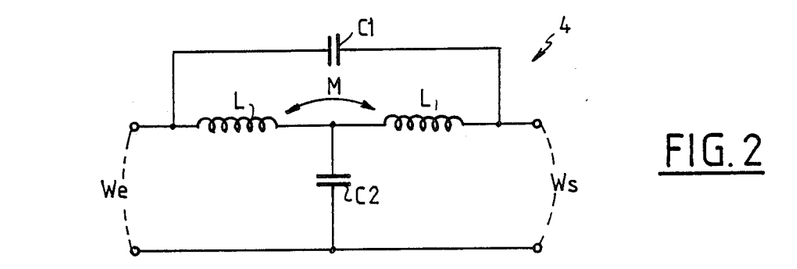
FIG. 2 is a diagram of the FIG. 1 elementary section in which a series capacitor has been added and is preferentially useable in accordance with the invention.

In FIG. 2, the two-port network 4 includes the same components as the section 2 described with reference to FIG. 1, together with an additional series capacitance $C_1$. The series capacitance $C_1$ is bridged across the two inductors L.

Figure 3:
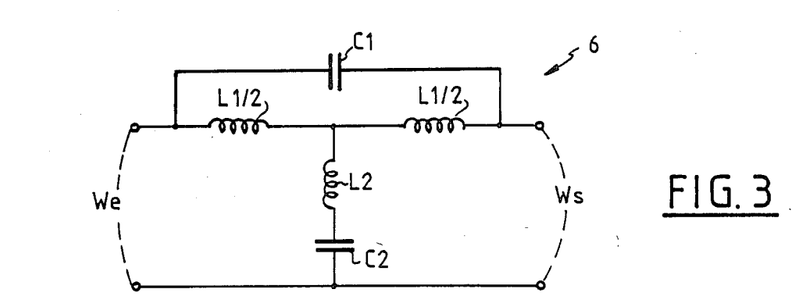
FIGS. 3 and 4 are two diagrams of different equivalents of the FIG. 2 section.

In FIG. 3, reference 6 designates a two-port network which is equivalent to but different from the two-port network of FIG. 2.

The section 6 comprises two inductors which together provide a series inductance which is equivalent to $L_1$; a series capacitance equivalent to $C_1$ is bridged across the two inductors giving the equivalent series inductance of $L_1$; there is also an equivalent parallel capacitance $C_2$ and an equivalent parallel inductance $L_2$. The two inductors having an equivalent series inductance of $L_1$ have a mutual inductance M, which also defines the equivalent parallel inductance $L_2$. The mutual inductance M between the two inductors providing the equivalent series inductance is therefore equal in absolute value to the equivalent parallel inductance $L_2$.

Figure 4:
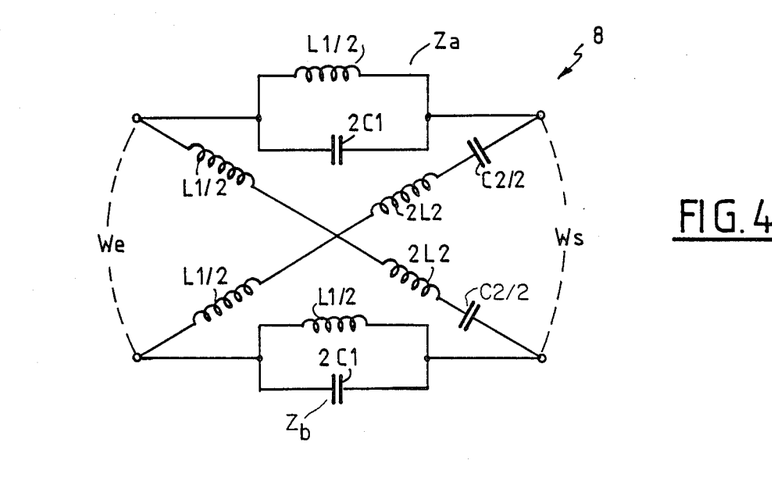

In FIG. 4, reference 8 designates a two-port network having the same components as the two-port network 6 described with reference to FIG. 3, but in a different disposition.

The two-port network 8 comprises:

two through series branches $Z_a$ each comprising a parallel connection of an inductance equal to one-half of the equivalent series inductance $L_1$ and a capacitance equal to twice the equivalent series capacitance $C_1$; and two crossed series branches $Z_b$ each comprising a series connection of an inductance equal to the sum of one-half of the equivalent series inductance $L_1$ and twice the equivalent parallel inductance $L_2$, together with a capacitance equal to one-half of the equivalent parallel capacitance $C_2$.

Such a section 8 provides an all-pass filter having a phase law which is linear as a function of frequency providing it satisfies the relationship:

$$C_2 \cdot (1 + 4 \cdot (L_2/L_1)) = 4 \cdot C_1$$

when terminated on its image impedances, i.e. $Z_a \times Z_b = 50$ ohms.

However, section 8 cannot be made in practice using passive linear components. The essential characteristic of the invention is to transpose the relationship of section 8 to equivalent section 4 whose components are realizable in practice, and to associate a phase law with said section 4 whose variation as a function of frequency shows a linear property so that said linear property may be used to constitute transmission lines for microwave analog signals at frequencies of about, for example, 2 GHz to 20 GHz.

For section 4, the relationship to be satisfied becomes as follows:

$$C_2 \cdot \left( \frac{L - M}{L + M} \right) = 4 \cdot C_1$$

where $L_1 = 2(L+M)$ and $L_2 = -M$.

The phase shift D of the signal between the inlet and the outlet of section 4 described with reference to FIG. 2 satisfies the expression:

$$D = 2 \, \text{Arctan} \left( \frac{xk}{1 - xk^2(1 + u)} \right)$$

where $u = -2M/(L+M)$ and $xk = 2\pi f \sqrt{(L+M) \cdot C_2}$ and f is the frequency of the signals transmitted.

Investigating the variation in phase shift as a function of frequency makes it possible to establish a phase law which is a linear function of frequency in a section in accordance with the invention.

Figure 5:
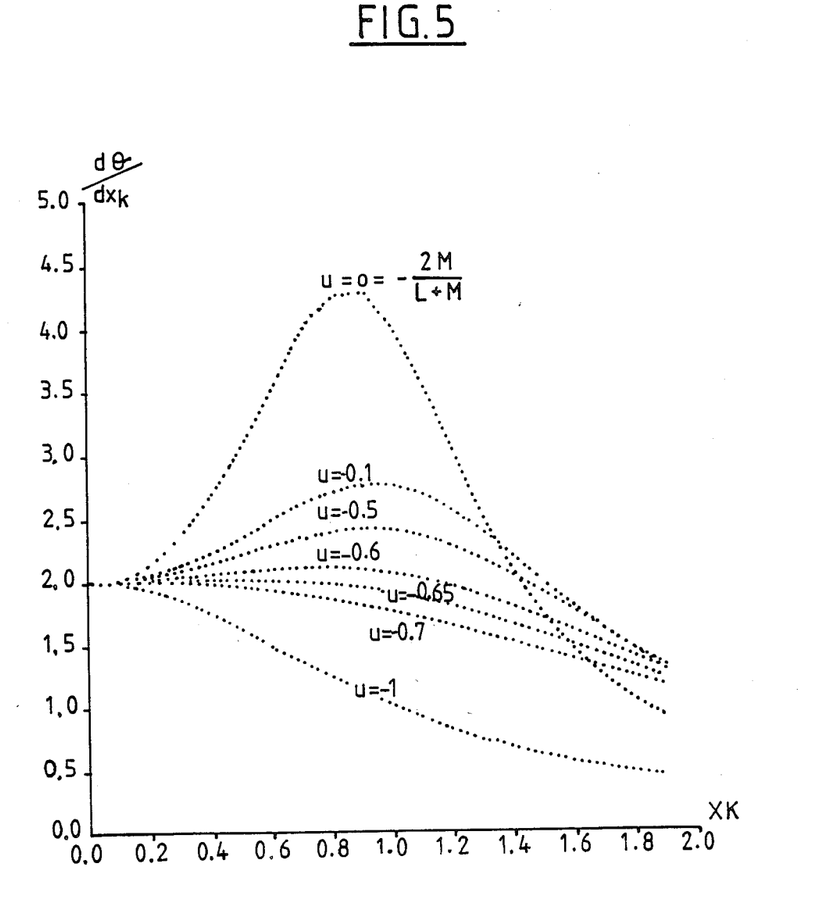
FIG. 5 is a graph showing the variation of a variable which is proportional to the delay provided by the circuit plotted as a function of another variable which is proportional to frequency, for various different values of a variable which is proportional to the quotients of the mutual inductance (M) divided by the sum of the mutual inductance (M) and the inductance (L)

FIG. 5 shows the variation of a variable which is proportional to the section delay as a function of a variable which is proportional to frequency. These variations are given for several different values of a variable u which is proportional to the quotient of the mutual inductance M divided by the sum of the inductance L and the mutual inductance M.

The ratio $d\theta/dxk$ (which is proportional to $d\theta/dw$, where w is the angular frequency of the transmitted signals, and which is consequently proportional to the delay D) is plotted along the Y-axis.

The term xk which is proportional to frequency is plotted along the X-axis.

It may be observed that for u lying between −0.6 and −0.65, the variation of $d\theta/dxk$ is constant up to a value of xk equal to 1.

The variation in phase shift is thus constant up to $xk = 1$, i.e. up to a cut-off frequency $w_c$ for which:

$$w_c = 2/(2\sqrt{(L+M)\cdot C_2})$$

Figure 6:
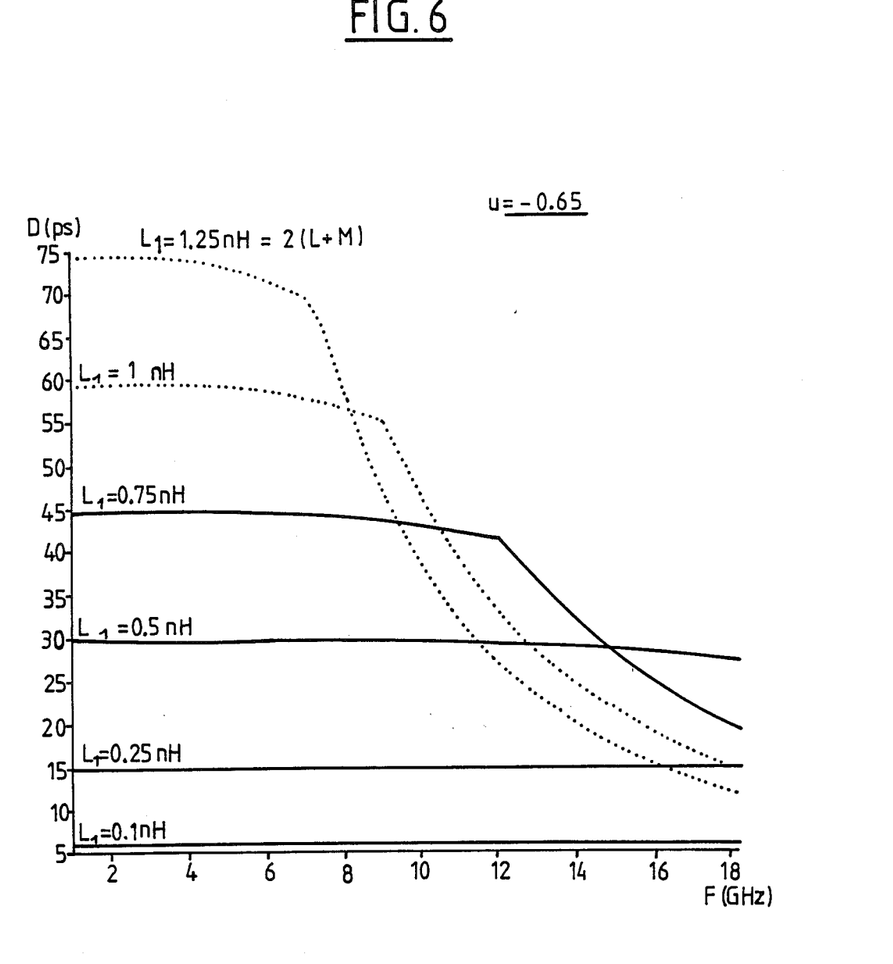
FIG. 6 is a graph showing the variation of the delay of the circuit as a function of frequency for various values of twice the sum of the inductance (L) and the mutual inductance (M)

FIG. 6 shows variation in delay D as a function of frequency. This variation is given for various different values of $L_1$ at $u = -0.65$.

The delay D is plotted up the Y-axis in picoseconds and frequency is plotted along the X-axis in gigahertz.

It may be observed that for an equivalent series inductance $L_1$ lying between 0.25 and 0.5 nanohenrys, the variation in the delay D as a function of frequency is constant over the frequency range 2 GHz to 20 GHz.

From the results of the curves shown in FIGS. 5 and 6, a linear phase law as a function of frequency is established ($u = -0.65$, $L_1 = 2(L+M) = 0.35$ nanohenrys, frequency 2 GHz to 22 GHz). This linear phase law is a function of frequency makes it possible to use the FIG. 2 section 4 for constituting a wideband all-pass filter.

Figure 7:
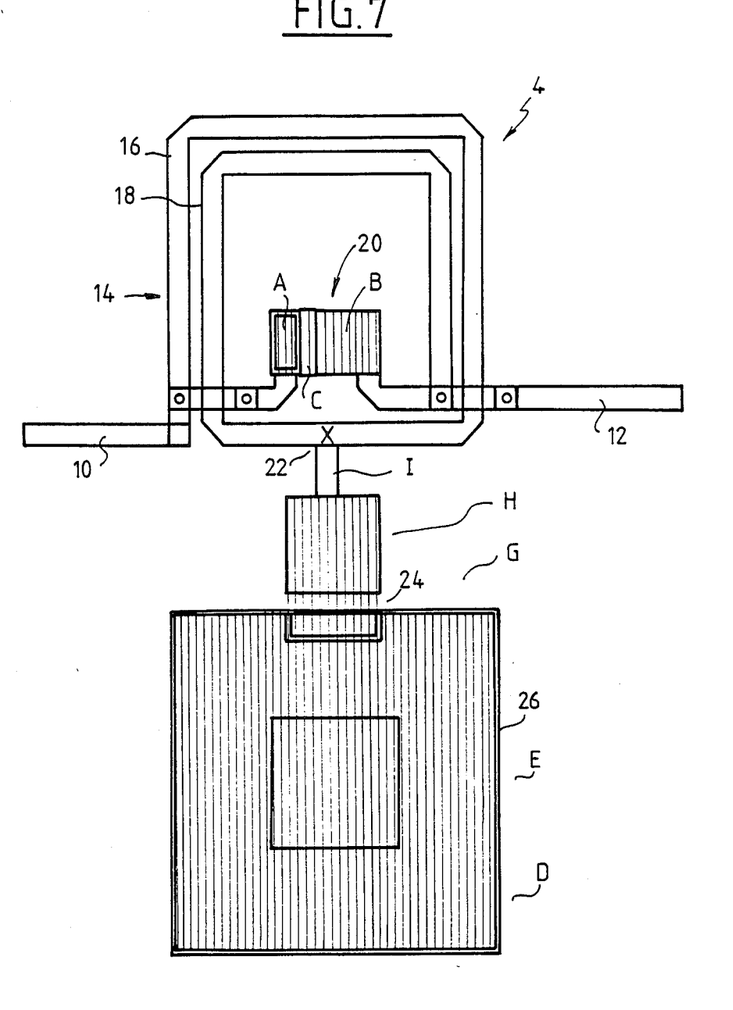
FIG. 7 is a plan showing the structure of a circuit in accordance with the invention.

FIG. 7 is a drawing showing the structure of the section 4 as described with reference to FIG. 2.

An inlet 10 and an outlet 12 situated at a distance apart from each other can be seen. Between the inlet 10 and the outlet 12 there is a spiral 14 which extends, particularly advantageously, over about one and three fourths of a turn. The outer tern 16 of the spiral 14 extends from the inlet 10 to a mid point 22 and constitutes the first inductor L forming one of the arms of the T of the bridged-T section 4.

The inner turn 18 of the spiral 14 extends from the mid point 22 to the outlet 12 and constitutes the second inductor L forming the other arm of the T of the bridged-T section 4.

The two turns 16 and 18 have mutual inductance M.

Advantageously, in order to obtain a linear phase law, the dimensions of the two turns 16 and 18 are such that the ratio u which is equal to minus two times the quotient of the mutual inductance M divided by the sum of the inductance L and the mutual inductance M is equal to −0.65. In other words, the dimensions of the two turns 16 and 18 are such that the quotient of the mutual inductance M divided by the sum of the inductance L and the mutual inductance M is equal to about +0.325.

The spiral 14 is connected in parallel with a capacitor 20 of metal-insulator-metal structure as described below. The capacitor 20 constitutes the equivalent series capacitance $C_1$ of the circuit in accordance with the invention. The metal electrodes of the capacitor are represented by A and B while the dielectric layer can be equated with a zone C.

The mid point 22 of the spiral 14 is connected via another capacitor 24 of metal-insulator-metal structure as described below to a ground plane 26.

The capacitor 24 constitutes the equivalent parallel capacitance $C_2$ of the circuit in accordance with the invention.

Advantageously, the width of both the inlet 10 and the outlet 13 is about 180 micrometers and the spiral and ground plane length is about 360 micrometers. The structure of this section therefore occupies a GaAs area of about 0.06 square millimeters for an equivalent air length of about 6 millimeters.

The equivalent series inductance $L_1$ which is equal to $2(L+M)$ has a value of about 0.35 nanohenrys.

Figure 8:
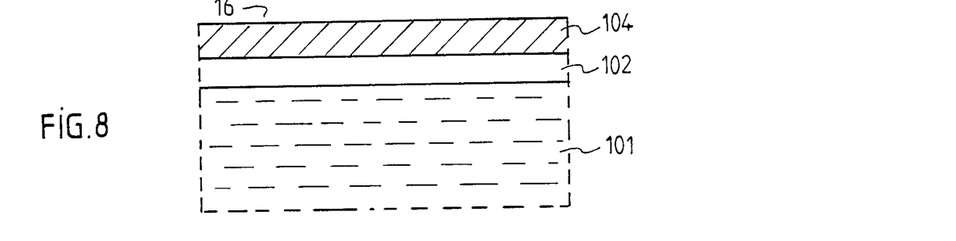
FIG. 8 is a section view through the structure of one of the inductors of a section.

FIG. 8 is a cross-section through the turn 16 of the spiral 14.

The structure of the turn 16 is constituted, for example, by a first layer 101 of GaAs having a thickness of about 100 micrometers. A second layer 102 e.g. of silicon nitride ($Si_3N_4$) is deposited to a thickness of about of about 0.65 micrometers on the first layer 101. A top metal layer 104 covers the layer 102, for example.

The thickness of the metal layer 104 is about 1 to 2.5 micrometers.

Figure 9:
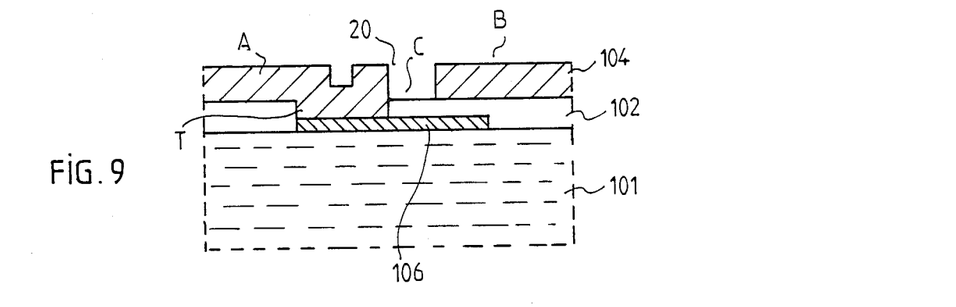
FIG. 9 is a section view through the metal-insulator-metal structure of a capacitor.

FIG. 9 shows the structure of the series equivalent capacitance $C_1$.

The metal-insulator-metal structure of the capacitor 20 is as follows: a first or "bottom" metal layer 106 is deposited on a first layer 101 of GaAs. The material constituting the metal layer 106 may be gold, for example, and it is about 1 micrometer thick. The assembly constituted by the layers 101 and 106 is covered in a layer 102 of dielectric such as $Si_3N_4$. A hollow is made in the layer 102 in order to provide a so-called "top via" transfer T. Finally, a "top" layer of metal 104 covers the assembly constituted by the layers 101, 106, and 102 and also fills the hollow T. The transfer T serves to connect the "top" metal to the "bottom" metal.

The layer 104 is not uniform since it is interrupted to define a zone C where the layer 102 is not covered by the layer 104.

The first plate of the capacitor 20 is defined by the layer 104 and its second plate is defined by the layer 106. The dielectric portion of the capacitance $C_1$ is defined by the layer 102.

The capacitance $C_1$ is proportional to the dielectric constant of the layer 102, and to the area which is sandwiched between the two metal layers 104 and 106, and it is inversely proportional to the thickness of the layer $Si_3N_4$.

The layers 106, 102, and 104 are deposited by techniques which are well known to the person skilled in the art, for example by vapor phase chemical deposition. The shape of the layer 104 is obtained by techniques which are well known to the person skilled in the art, for example the photolithographic technique using masks and etching.

The layer 106 representing the "bottom" metal is shown shaded in FIG. 7.

Figure 10:
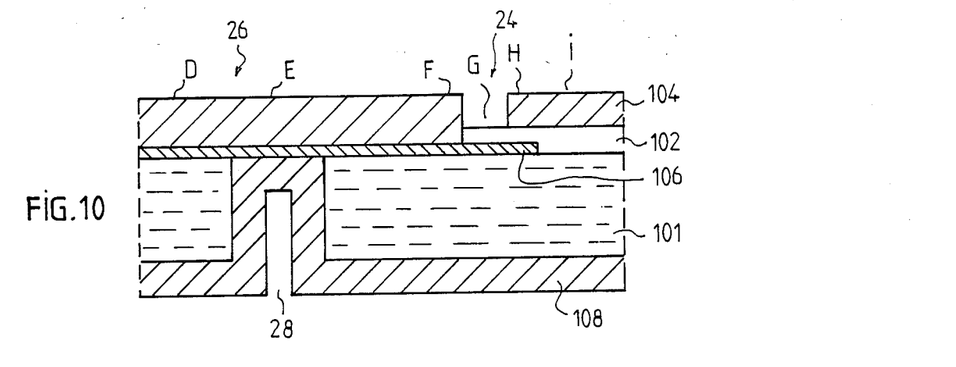
FIG. 10 is a section view through the ground plane structure of a section.

FIG. 10 shows the structure of the section at the ground plane 26 thereof. The capacitor 24 provided between the midpoint 22 and the ground plane 26 is represented by the assembly G and H. This capacitor $C_2$ has the same structure as the capacitor $C_1$, i.e. a metal-insulator-metal structure. The first plate of the capacitor $C_2$ is defined by the layer 104, whereas the second plate of the capacitor $C_2$ is defined by the layer 106. The layer 102 defines the dielectric portion of the capacitor 24.

The ground plane represented by the assembly D and E extends the capacitor 24. The ground plane 26 comprises a "bottom" metal layer 106 on a layer 101 of GaAs. The layer 106 extends over the entire length of the ground plane 26. A hole 28 is made through the layer 101 after all of the upper layers have been deposited. Finally, a layer 108 of metal is deposited on the layer 101 and fills the hiole 28 so that the ground on the bottom plane of the circuit reaches the top plane thereof.

Figure 11:
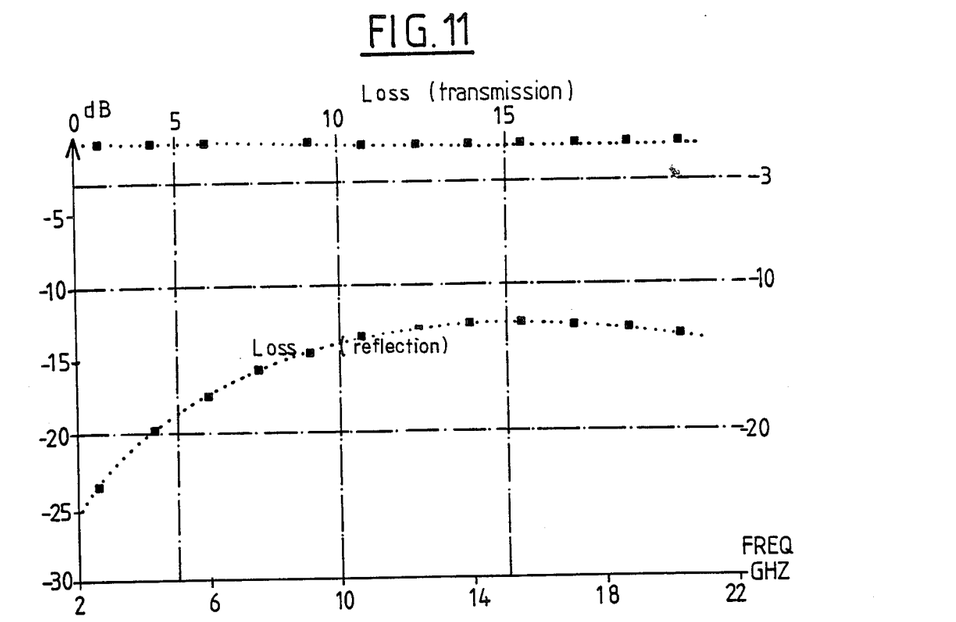
FIG. 11 is a graph showing variation in loss (both transmission loss and reflection loss) as a function of frequency for a circuit in accordance with the invention.

FIG. 11 shows section loss as a function of frequency.

Loss is plotted in decibels (dB) up the Y-axis and frequency in gigahertz is plotted along the X-axis. The losses are due to poor image impedance matching and to the resistance of the material from which the inductors are made. This result is very useful for obtaining the section's linear phase law. This simulation was performed on a section whose capacitors had the following capacitances: $C_2=440$ femtofarads and $C_1=40$ femtofarads, and having a 15 micrometer gap between the first turn 16 and the second turn 18.

It may be observed that there is less than 1 dB of transmission loss up to 22 GHz, i.e. that an all-pass filter function is indeed being obtained.

Figure 12:
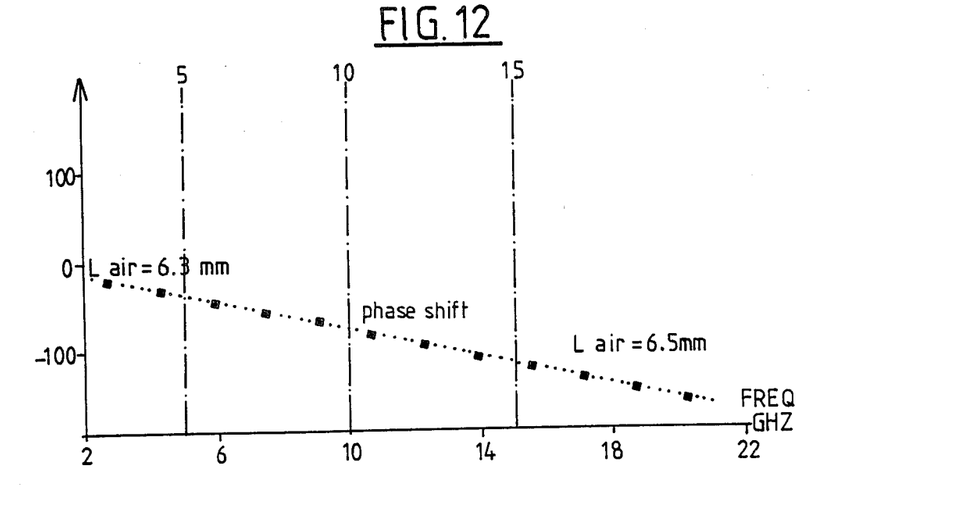
FIG. 12 is a graph showing variation in phase shift of a circuit in accordance with the invention as a function of frequency.

FIG. 12 shows the change in phase shift through the section as a function of frequency.

Phase shift is plotted in degrees along the Y-axis and frequency is plotted in gigahertz along the X-axis. Over the frequency range 2 GHz to 22 GHz, the equivalent length in air varies from 6.3 millimeters to 6.5 millimeters. This curve indicates that the phase law is indeed linear. By virtue of the invention, a GaAs area of 0.1 square millimeters is capable of providing a transmission line equivalent to a line in air having a length of order 1 centimeter, thereby saving a very great deal of space, up to about 10 times compared with conventionally embodied transmission lines.

Figure 13:
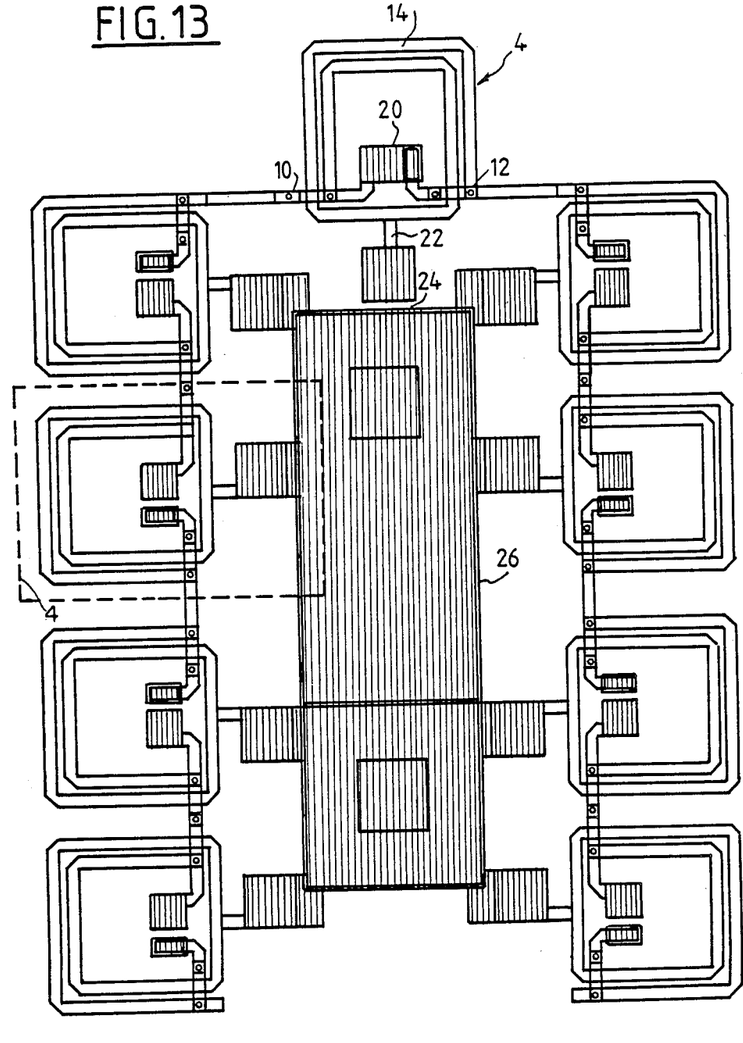
FIG. 13 shows a particular disposition of nine sections distributed around a common ground plane in accordance with the invention.

FIG. 13 shows a cascade of a plurality of sections 4 of the type described with reference to FIG. 7. This cascade is made possible by virtue of image impedance matching. FIG. 13 shows nine sections 4 connected in series. These sections 4 are distributed around a common ground plane 26. This disposition of nine sections 4 takes up a total area of 800×600 micrometers. Such a disposition of nine sections 4 makes it possible to obtain a transmission line whose equivalent length in air is 5 centimeters. The plan of this disposition of nine sections is obtained using Computer Aided Design (CAD) tools.

Figure 14:
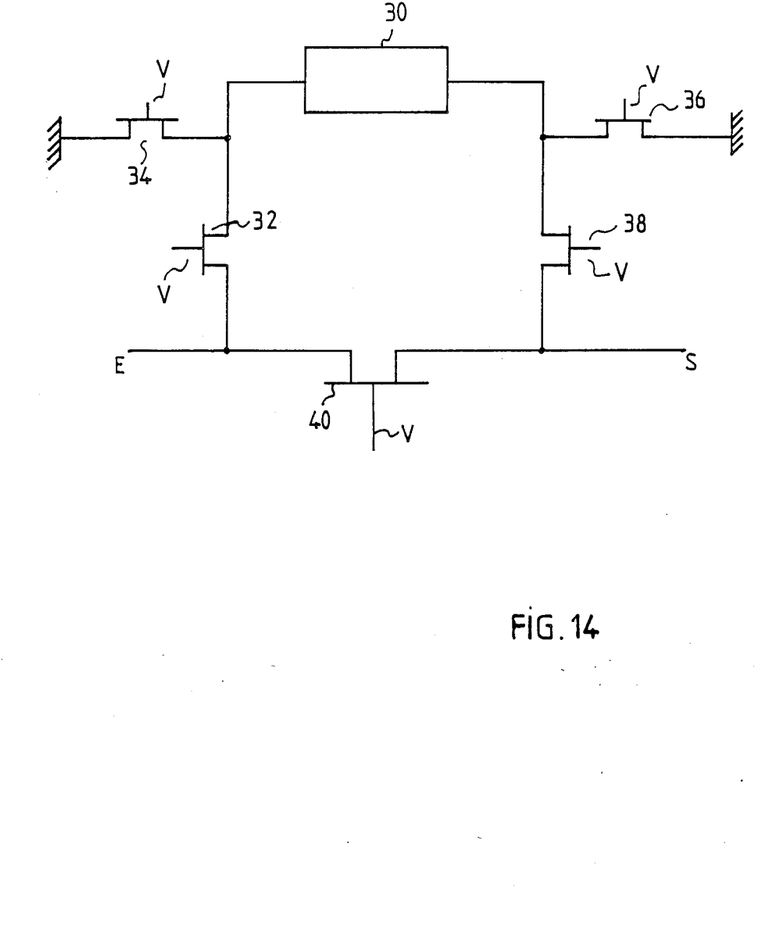
FIG. 14 is a diagram showing the switching that may be applied to a transmission line of programmable length in accordance with the invention.

In FIG. 14, reference 30 designates a plurality of sections 4 connected in series as described with reference to FIG. 13, thereby defining a portion of delay line whose length is proportional to the number of sections 4. This plurality of sections 4 is switched by means of field effect transistors. This plurality of delay lines 30 is connected via transistors 32 and 34 to the inlet E of the delay line as a whole and via transistors 36 and 38 to the outlet S of the delay line as a whole. The transistors 32 and 38 are series connected, i.e. their sources are connected to their drains under the control of their gates which receive a voltage V for controlling transistor switching 40. For example, when the voltage V applies to the gate of a transistor is equal to $-9$ volts, the transistor is equivalent to a capacitance $C_{off}$, which means the transistor is in its off state, whereas when the voltage V applied to the gate of the transistor is equal to 0 volts, the transistor becomes equivalent to a resistance $R_{on}$, i.e. the transistor is in a conducting state.

The transistors 34 and 36 are parallel-connected, i.e. their sources or their drains are connected to ground. Their gates receive a voltage V which controls transistor switching. For example, when the voltage V applied to the gate of one of these transistors is equal to $-9$ volts, the transistor is equivalent to its capacitance $C_{off}$, thereby putting the transistor in its off state, whereas when the control voltage is equal to 0 volts, the transistor becomes equivalent to its resistance $R_{on}$, thereby putting the transistor in an on state.

When the transistors 32 and 34 are on and the transistors 36, 38, and 40 are off, the transmission signal passes from the inlet E of the delay line via the plurality 30 of sections 4 and thus reaches the outlet S of the delay line. Conversely, when the transistors 36, 38, and 40 are on while the transistors 32 and 34 are off, the transmission signal passes from the inlet E, via on transistor 40, to the outlet S of the delay line (without passing through the plurality 30).

We claim:

1. A microwave circuit comprising:
   at least one "M-derived" section type two-port network connected as an all-pass filter and having a phase law which is a linear function of frequency, the two-port network including:
   two inductors having the same inductance L connected in series to form the two arms of the T of the "M-derived" section, the inductors having a mutual inductance M;
   a capacitor having one end connected to the junction of the two inductors to define a riser of the T, the capacitor having a capacitance $C_2$; and
   another capacitor connected in parallel to the series connected inductors to form the bridge of the "M-derived" section, the bridge capacitor having a capacitance $C_1$;
   and wherein the circuit substantially satisfies the relationship:

$$C_2 \cdot \left( \frac{L-M}{L+M} \right) = 4 \cdot C_1.$$

2. A circuit according to claim 1, wherein the two-port network is mounted so that it is switchable in parallel with a direct path which substantially constitutes a short circuit.

3. A microwave delay circuit comprising:
   at least one bridged-T section type two-port network connected as an all-pass filter and having a phase law which is a linear function of frequency, said two-port network being mounted such that it can be switched in parallel with a direct path which substantially constitutes a short circuit; and
   wherein the bridged-T section type two-port network comprises:
   two inductors having the same inductance L connected in series to form the two arms of the T, the inductors having a mutual inductance M;
   a capacitor having one end connected to the junction of the two inductors to define a riser of the T, the capacitor having a capacitance $C_2$; and
   another capacitor connected in parallel to the series connected inductors to form the bridge of the bridged-T section, said bridge capacitor having a capacitance $C_1$;
   and wherein the circuit substantially satisfies the relationship:

$$C_2 \cdot \left( \frac{L-M}{L+M} \right) = 4 \cdot C_1.$$

4. A circuit according to claim 3, wherein the quotient of the mutual inductance M divided by the sum of the inductance L and the mutual inductance M lies between +0.2 and +0.4, and lies preferably between about +0.27 and +0.34.

5. A circuit according to claim 4, wherein said quotient lies between +0.30 and +0.33.

6. A circuit according to claim 3, wherein the two-port network has matching impedances at its inlet and at its outlet, and that each of said impedances is approximately 50 ohms.

7. A circuit according to claim 3, wherein the two-port network comprises a bottom base layer fabricated on gallium arsenide using monolithic technology.

8. A circuit according to claim 7, wherein the two-port network comprises at least one elementary section which, between an inlet and an outlet which are situated at a distance apart, is constituted by a spiral connected in parallel with a capacitor of metal-insulator-metal structure, with the mid-point of the spiral being connected via another capacitor of metal-insulator-metal structure to a ground plane.

9. A circuit according to claim 8, wherein the spiral extends over approximately one and three fourths turns.

10. A microwave transmission line of programmable length, comprising:
- a microwave delay circuit including at least one bridged-T section type two-port network, connected as an all-pass filter and having a phase law which is a linear function of frequency, the two-port network being mounted such that it can be switched in parallel with a direct path substantially constituting a short circuit; and
- wherein the bridged-T section type two-port network comprises:
- two inductors having the same inductance L connected in series to form the two arms of the T, the inductors having a mutual inductance M;
- a capacitor having one end connected to the junction of the two inductors to define a riser of the T, the capacitor having a capacitance $C_2$; and
- another capacitor connected in parallel to the series connected inductors to form the bridge of the bridged-T section, said bridge capacitor having a capacitance $C_1$;
- and wherein the circuit substantially satisfies the relationship:

$$C_2 \cdot \left( \frac{L-M}{L+M} \right) = 4 \cdot C_1.$$

11. A microwave delay circuit comprising:
- a plurality of series connected bridged-T section two-port networks distributed around a periphery of a common ground plane, each of the plurality of two-port networks being connected as an all-pass filter and having a phase law which is a linear function of frequency, each of the two-port networks being mounted such that it can be switched in parallel with a direct path substantially constituting a short circuit; and
- wherein each bridged-T section type two-port network comprises:
- two inductors having the same inductance L connected in series to form the two arms of the T, the inductors having a mutual inductance M;
- a capacitor having one end connected to the junction of the two inductors to define a riser of the T, the capacitor having a capacitance $C_2$; and
- another capacitor connected in parallel to the series connected inductors to form the bridge of the bridged-T section, said bridge capacitor having a capacitance $C_1$;
- and wherein the circuit substantially satisfies the relationship:

$$C_2 \cdot \left( \frac{L-M}{L+M} \right) = 4 \cdot C_1.$$

* * * * *